US006501783B1

United States Patent
Capasso et al.

(10) Patent No.: US 6,501,783 B1
(45) Date of Patent: Dec. 31, 2002

(54) DISTRIBUTED FEEDBACK SURFACE PLASMON LASER

(75) Inventors: Federico Capasso, Westfield, NJ (US); Alfred Yi Cho, Summit, NJ (US); Claire F. Gmachl, New Providence, NJ (US); Albert Lee Hutchinson, Piscataway, NJ (US); Deborah Lee Sivco, Warren, NJ (US); Alessandro Tredicucci, Summit, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/512,566

(22) Filed: Feb. 24, 2000

(51) Int. Cl.$^7$ .............................. H01S 5/00; H01S 3/08
(52) U.S. Cl. ............................ 372/96; 372/43; 372/102
(58) Field of Search .............................. 372/96, 46, 43, 372/44, 54, 64, 102

(56) References Cited

U.S. PATENT DOCUMENTS

| 5,502,787 A | 3/1996 | Capasso et al. |
| 5,555,255 A | 9/1996 | Köck et al. |
| 5,568,504 A | 10/1996 | Köck et al. |
| 5,901,168 A | 5/1999 | Baillargeon et al. |
| 5,991,048 A | 11/1999 | Karlson et al. |

FOREIGN PATENT DOCUMENTS

| EP | 0 977 329 | 2/2000 |
| JP | 20001 38420 | 5/2000 |

OTHER PUBLICATIONS

Sirtori et al, Long wavelength semiconductor lasers with waveguide based on surface plasmons, Optics Letters, vol. 23, No. 17, Sep. 1, 1998, pp. 1366–1368.*

Schrenk et al, GaAs/AlGaAs distributed feedback quantum cascade lasers, applied physics, vol. 76, No. 3, Jan. 17, 2000, 253–255.*

G. Strasser, S. Gianordoli, L. Hvozdara, W. Schrenk, K. Unterrainer, E. Gornik GaAs/AlGaAs Superlattice Quantum Cascade Lasers at λ≈13 µm, Applied Physics Letters, vol. 75, No. 10, Sep. 6, 1999.

Gaetano Scamarcio, Federico Capasso, Carlo Sirtori, Jerome Faist, Albert L. Hutchinson, Dedorah L. Sivco Alfred V. Cho "High–Power Infrared (8–Micrometer Wavelength) Superlattice Lasers" Science, vol. 276 pp. 773–776, May 2, 1997.

Carlo Sitori, Claire Gmachl, Federico Capasso, Jerome Faist, Deborah L. Sivco, Albert L. Hutchinson, Alfred Y. Cho "Long–Wavelength Semiconductors Lasers with Waveguides Based on Surface Plasmons" Optics Letters vol. 23, No. 17/Sep. 1, 1998.

Alessandro Tredicucci, Claire Gmachl, Federico Capasso, Deborah Sivco, Albert L. Hutchinson, Alfred Yi Cho, "Long Wavelength Superlattice Quantum Cascade Lasers at λ≈17 µm" Applied Physics Letters, vol. 74, No. 5, Feb. 1, 1999.

Federico Capasso, Alessandro Tredicucci, Claire Gmachl, Deborah Sivco, Albert L. Hutchinson, Alfred Yi Cho, Gaetano Scamarcio, "High–Performance Superlattice Quantum Cascade Lasers".

(List continued on next page.)

*Primary Examiner*—Paul Ip
*Assistant Examiner*—Armando Rodriguez
(74) *Attorney, Agent, or Firm*—Wendy W. Koba, Esq.

(57) ABSTRACT

A surface plasmon laser structure is formed to include a DFB structure as the metal carrying layer, thus forming a single mode surface plasmon laser. The DFB structure comprises a multiple layer metallic surface guiding structure (for example, titanium stripes covered with a layer of gold. forming alternating Ti/Au—Au stripes). The active region, in one embodiment, may comprise a quantum cascade structure.

17 Claims, 6 Drawing Sheets

OTHER PUBLICATIONS

Alessandro Tredicucci, Federico Capasso, Clarie Gmachl, Deborah L. Sivco, Albert L. Hutchinson, Alfred Y. Cho "High Performance Interminiband Quantum Cascade Lasers With Graded Superlattices", Applied Physics Letters, vol. 73, No. 15, Oct. 12, 1998.

W. Schrenk, Et Al. "GaAs/AlGaAs Distributed Feedback Quantum Cascade Lasers", Applied Physics Letters, American Institute of Physics, New York, US, vol. 76, No. 3 Jan. 17, 2000, pp. 253–255.

Gmachl, Et Al. "High Power and Tunable Single–Mode Quantum Cascade Lasers" IUMRS, International Conference on Advanced Materials, Symposium N: Compound Semiconductors, Beijing, China, Jun. 13–18, 1999 & Materials Science & Engineering B (Solid State Materials for Advanced Tecnology) Jun. 1, 2000 Elsevier, Switzerland, vol. 875, No. 2–3, p. 93–99, p. 97, left–hand column—p. 98 paragraph 2; fig. 6.

Faist J, Et Al "Distributed Feedback Quantum Cascade Lasers" Applied Physics Letters, American Institute of Physics New York US, vol. 70, No. 20, May 19, 1997, pp. 2670–2672.

\* cited by examiner

10

10

DISTRIBUTED FEEDBACK SURFACE PLASMON LASER

BACKGROUND OF THE INVENTION

The present invention relates to a surface plasmon laser structure and, more particularly, to a surface plasmon laser including a distributed feedback (DFB) structure to provide long wavelength, single mode operation.

SUMMARY OF THE PRIOR ART

Existing technologies for long wavelength injection lasers based on interband transitions in III–V semiconductor materials are typically limited to $\lambda < 5$ μm, leaving a considerable part of the mid- to far-infrared spectrum accessible only by lead-salt lasers.

However. quantum cascade (QC) lasers operating on intersubband transitions between conduction band states in InGaAs/AlInAs heterostructures have proven so far to be extremely versatile, covering the range of wavelengths of the two atmospheric windows (3.4–13 μm), and providing high optical power at room temperature. When formed as a distributed feedback (DFB) device (including a grating structure embedded in the optical waveguide. in the immediate vicinity of the active region), single mode operation is possible. Optical waveguiding is achieved by virtue of the inner core (active) region having a higher refractive index than the surrounding (outer) cladding region. At longer wavelengths, however, the total thickness of the waveguide layers (core plus claddings) becomes difficult to handle and, moreover, light absorption by free carriers (particularly in the relatively high doped n-type QC cladding layers) results in even greater signal losses. Additionally, DFB structures operating at longer wavelengths require an extremely deep etch to form the grating structure, making regrowth problematic and leaving weakly coupled gratings far away from the active region as the only option. All of these difficulties result in the DFB structure being an unattractive candidate for long wavelength applications.

However, Maxwell's laws of electromagnetism allow for another type of optical confinement to take place at the interface between two different homogeneous materials. These light waves exist, characterized by an exponentially decaying intensity in the two directions normal to the interface, provided the dielectric constants ($\in$) of the two materials have real parts of opposite sign. For a given radiation frequency, one single confined mode results, with the magnetic field polarized parallel to the interface and normal to the propagation direction (i.e;, transverse magnetic (TM) polarization).

Dielectric constants having a negative real part typically appear in the electromagnetic response of charged harmonic oscillators, more specifically, at frequencies above the oscillator resonance $\omega_0$ and up to a frequency $\omega_L$, where $\in(\omega_L)=0$ and purely longitudinal modes can propagate. In metals or high-doped semiconductors. the existing nearly free electrons behave as simple oscillators of exactly zero resonance frequency for transverse excitation, while at the same time displaying very high $\omega_L$, generally in the visible or even in the UV wavelength range. The latter takes the name of "plasma frequency" $\omega_p$, being the frequency of charge density oscillations. Thus, metals present an extremely wide range of wavelengths where $Re[\in]<0$, and where the metals can support the interface-confined electromagnetic waves, the waves referred to as "surface plasmons". The possibility of using surface plasmons in place of more conventional multi-layer dielectric waveguides at optical frequencies has been recently explored in the field of mid-infrared semiconductor lasers. However, the marginal performances of these surface plasmon devices cannot compete with those of traditional layered structures.

There remains a need in the art, therefore, for a relatively long wavelength laser (i.e., $\lambda > 15$ μm) that is not prohibitively thick, nor as technically difficult to manufacture as DFB devices.

SUMMARY OF THE INVENTION

The need remaining in the art is addressed by the present invention, which relates to a surface plasmon laser structure and, more particularly, to a surface plasmon laser including a distributed feedback (DFB) structure for providing single mode, long wavelength (e.g., $\lambda = 17$ μm) emission.

A surface plasmon laser includes an active region formed as an insulated ridge structure and further comprises a metal surface layer disposed longitudinally along the ridge, contiguous with the active region. The structure results in the formation of surface plasmon propagation, where at wavelengths greater than 15 μm it has been found that the power loss associated with penetration depth (i.e., skin depth) into the metal is largely reduced. The resultant large mode confinement $\Gamma$ with the attendant reduced thickness of the waveguide layers (reduced from a prior art thickness of approximately 9 μm to less than 4 μm) is advantageously used to create a long wavelength laser.

In accordance with the teachings of the present invention, the metal surface layer comprises a metallic grating (i.e.; periodic) surface structure, thus forming a DFB surface plasmon laser capable of single mode emission. In one embodiment, titanium stripes are first deposited on the exposed surface of the active region, followed by a continuous layer of gold. The resulting Ti/Au—Au grating provides single mode plasmon radiation output, where the output wavelength can be "tuned" by modifying the operating temperature of the device.

In a particular embodiment of the present invention, the active region of the DFB surface plasmon laser may comprise a quantum cascade (QC) structure, including a multiplicity of essentially identical repeat units, each repeat unit comprising one or more quantum wells. Successive carrier transitions from a higher to a lower energy state result in photon emissions, with the photon energy depending on the structure and compositional details of the repeat unit.

Other and further advantages and arrangements of the present invention will become apparent during the course of the following discussion and by reference to the accompanying drawings.

BRIEF DESCRIPTION OF THE DRAWINGS

Referring now to the drawings.

DETAILED DESCRIPTION

Mid- to far-infrared semiconductor lasers are typically employed in gas sensing applications, where spectroscopic techniques with high resolution and sensitivity should be implemented. For this purpose, therefore, single mode devices are desired. In most cases, QC laser or diode lasers implementing a DFB resonator (incorporating a grating of appropriate period and strength) are used as the single mode device. Such a structure introduces a modulation of the refractive index $n_{eff}$ and of the attenuation coefficient $\alpha_w$ (or of the effective net gain) favoring the optical mode which best matches the grating period over all other possible longitudinal modes.

Figure 1:
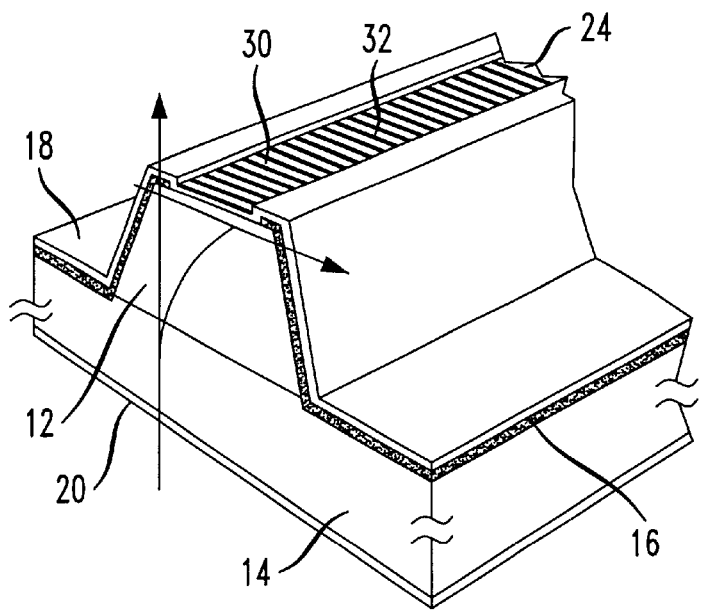
FIG. 1 is an isometric view of a DFB plasmon laser formed in accordance with the present invention.
Figure 2:
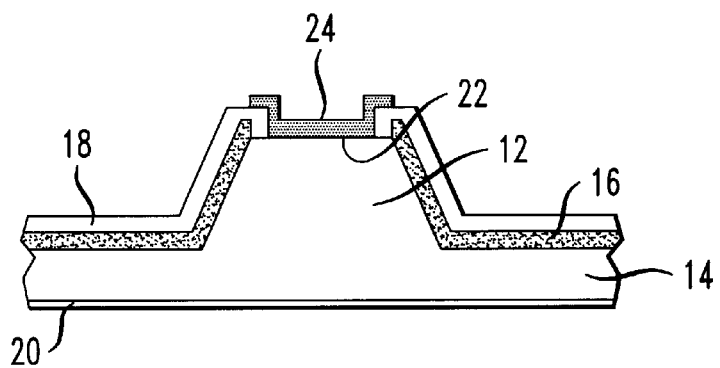
FIG. 2 is an illustration of the front facet of the device of FIG. 1.

An isometric view of an exemplary; single mode surface plasmon laser 10 formed in accordance with the present invention is illustrated in FIG. 1. Laser 10 includes an active region 12 formed of, for example, InGaAs/AlInAs, grown on an InP substrate 14. Active region 12 is formed as a ridge (using wet chemical etching, for example), with an insulator 16 deposited on the sides of the ridge, as well as across the top surface of InP substrate 14. Silicon dioxide is an exemplary insulator useful for this purpose. A front facet view of laser 10 is shown in FIG. 2 and clearly illustrates the location of insulator 16 on the side surfaces of active region 12 and top surface of substrate 14. Top electrical contact 18 and bottom electrical contact 20 are then formed (using e-beam evaporation, for example), leaving a wide portion of top surface 22 of active region ridge 12 exposed for the following deposition of a metallic surface plasmon carrying layer 24.

Figure 3:
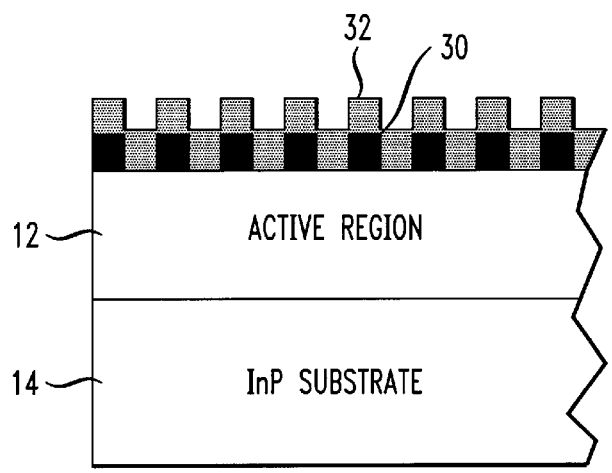
FIG. 3 is a cut-away side view of the single mode DFB surface plasmon laser of FIG. 1.

In accordance with the present inventions the surface plasmon nature of the electromagnetic mode advantageously provides for incorporating a DFB structure in the laser without the necessity of using any etching procedures. The particular metals chosen for the surface metallic layer of the surface plasmon structure have been found to strongly affect the penetration depth of the mode, and with it both the refractive index and attenuation loss factor. In one embodiment, metallic layer 24 may comprise a layer of gold (approximately 300 nm thick, for example), which provides for a relatively large negative value for the real part of the dielectric constant (Re $[\in_{Au}]$~-1.1×10$^4$ at $\lambda$~17 $\mu$m) and a relatively shallow penetration depth into the metal. Alternatively, titanium (which exhibits a much less negative dielectric constant—Re $[\in_{Ti}]$~-1×10$^3$ at $\lambda$=17 $\mu$m—and larger penetration depth) may be used. For example, deposition of a relatively thin (e.g., 10 nm) of titanium before a thicker (e.g., 300 nm) layer of gold yields a variation of the refractive index $\Delta n_{eff}/n_{eff}$~1.8×10$^{-3}$ and a variation of the attenuation losses $\Delta \alpha_w/\alpha_w$~1.5×10$^{-2}$ with respect to pure gold. By introducing spatial modulation into this variation across the ridge of an exemplary surface plasmon laser of the present invention, a single mode, long wavelength DFB device may be formed. One exemplary embodiment, as illustrated in FIGS. 1–3, includes a dual-metallic Ti/Au—Au structure. In particular, optical contact lithography (or any other suitable process) may be used to form a first-order Bragg grating (exhibiting a nominal duty cycle of 50%) of titanium stripes 30, as shown in FIG. 3, where a deposition of 10 nm of titanium has been used. A subsequent evaporation of a relatively thick (e.g., 300 nm) gold layer 32 effectively results in an alternate sequence of Ti/Au and pure Au stripes 30,32 across top surface 22 of active region 12, as illustrated in FIG. 3. Although this particular embodiment uses a dual metal structure, various other multiple metal grating structures can be used. For example, a tri-metal grating structure may be used.

The relationship Re$[\in]$=$n^2$-$k^2$ between the dielectric constant $\in$, the refractive index n, and the extinction coefficient k implies that materials with negative Re$[\in]$ are usually very absorptive. For this reason, the attenuation coefficient ax of a surface plasmon guided mode depends strongly on the penetration (or skin) depth $\delta$ in the metallic carrying layer (layer 24 in device 10 of FIGS. 1 and 2), decreasing as the latter is decreased. With $\in_1$ being the dielectric constant of the metal (layer 24) and $\in_2$ being the dielectric constant of the semiconductor (active region 12), penetration depth $\delta$ can be expressed as follows:

$$\delta = \frac{1}{2}\left|\text{Re}\left[\frac{\omega \varepsilon_1}{c}\sqrt{\frac{-1}{\varepsilon_1+\varepsilon_2}}\right]\right|^{-1}$$

where $\omega/2\pi$ is the frequency of the electromagnetic wave and c is the speed of light in vacuum. From the above, it follows that a large negative Re$[\in_{1]\,(k}{}^2$>>$n^2$) implies a small $\delta$, which entails a lower optical loss. From the above, the attenuation $\alpha$ can be easily derived in the case of a real positive $\in_2$:

$$\alpha = \frac{\varepsilon_2^{3/2}\text{Im}[\varepsilon_1]}{\{\text{Re}[\varepsilon_1](\varepsilon_2+\text{Re}[\varepsilon_1])^3\}^{1/2}}\frac{\omega}{c}$$

To a first approximation. the frequency-dependent dielectric constant of a metal can be represented by the simple Drude free-carrier expression:

$$\text{Re}[\varepsilon_1(\omega)] = \varepsilon_\infty\left(1-\frac{\omega_p^2}{\omega^2+\gamma^2}\right)$$

$$\text{Im}[\varepsilon_1(\omega)] = \frac{\varepsilon_\infty \omega_p^2 \gamma}{\omega(\omega^2+\gamma^2)}$$

where $\in$ is the background dielectric constant and $\gamma^{-1}$ is a phenomenological scattering time.

It has been discovered in accordance with the present invention that surface plasmon waveguides become less lossy as the radiation wavelength is increased, owing to the Lorentzian dependence of $\in$. Metallic waveguides are, in fact, commonly used in microwave applications and, although they present more complicated three-dimensional geometries allowing also for TE and TEM mode propagation, in the simplest designs (i.e., "microstrips"), the fundamental TM mode is again of a surface plasmon nature.

Figure 4:
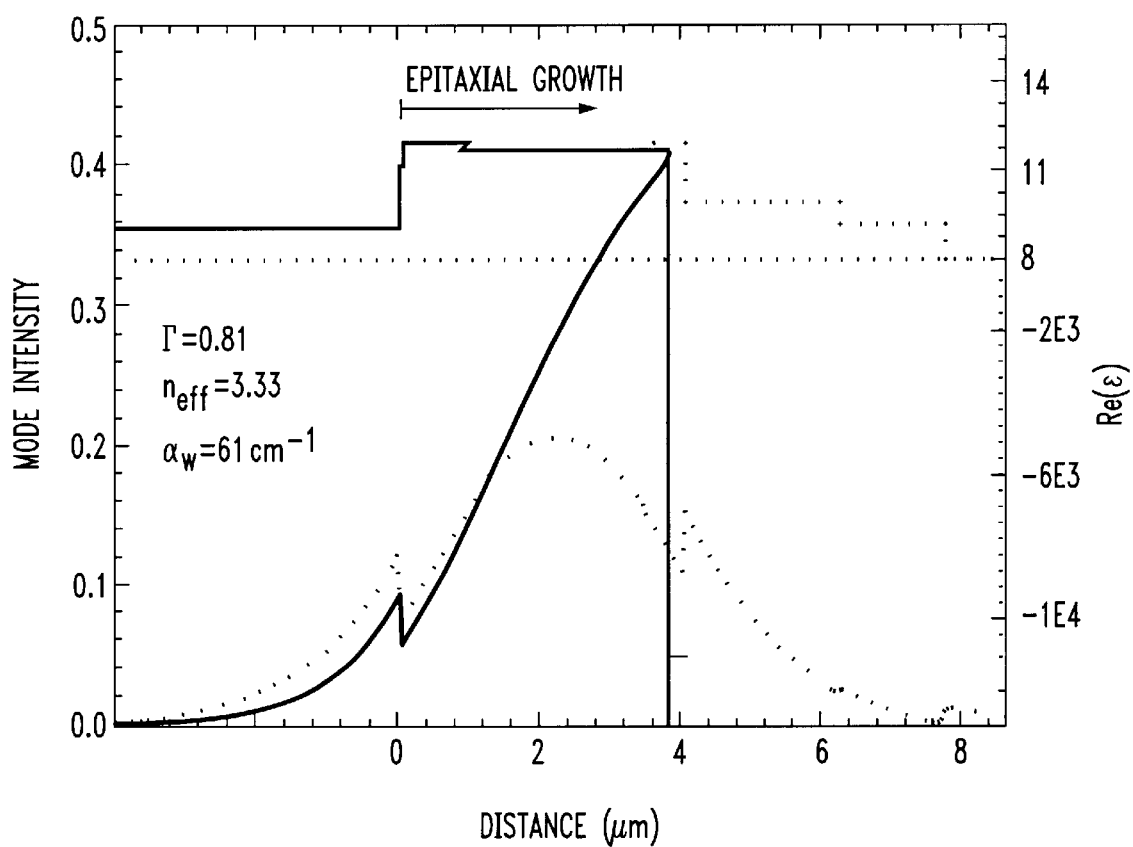
FIG. 4 is a graph comparing the mode intensity and the real part of the dielectric constant of an exemplary surface plasmon laser formed in accordance with the present invention with a conventional dielectric waveguide.

FIG. 4 shows the dielectric profiles with the corresponding surface plasmon mode calculated using the transfer matrix method, together with the values of the confinement factor Γ (defined as the normalized integral of the optical mode over the active material), waveguide attenuation $α_w$, and modal effective refractive index $n_{eff}$. For comparison, the mode profile associated with a conventional prior art semiconductor-cladding waveguide is also shown. As evident from the graph of FIG. 4, the thickness of the epitaxial growth is reduced from the prior art value of almost 9 μm to less than 4 μm, while at the same time concentrating the field intensity in the active material, thereby raising Γ from 0.47 to 0.81.

Figure 5:
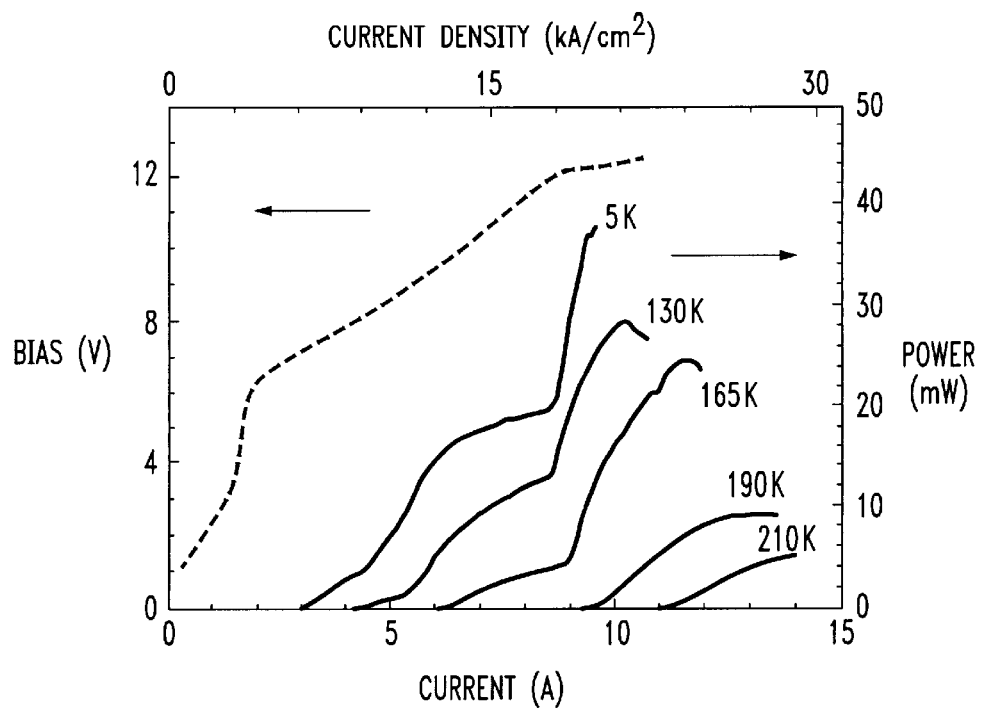
FIG. 5 is a graph illustrating the L-I characteristics and current-voltage characteristic of an exemplary surface plasmon laser.

The light output (L)—current (I) (solid lines) and current-voltage (V) (dashed line) characteristics of a 1.4 mm long and 34 μm wide, deep etched, ridge waveguide laser operated in pulsed mode (50 ns pulse width, 5 kHz duty-cycle) is shown in FIG. 5. The optical power is measured from a single facet with 50% collection efficiency. The I–V characteristic is measured at a temperature of 5K, where the L-I curves are shown at temperatures indicated in the graph.

Figure 6:
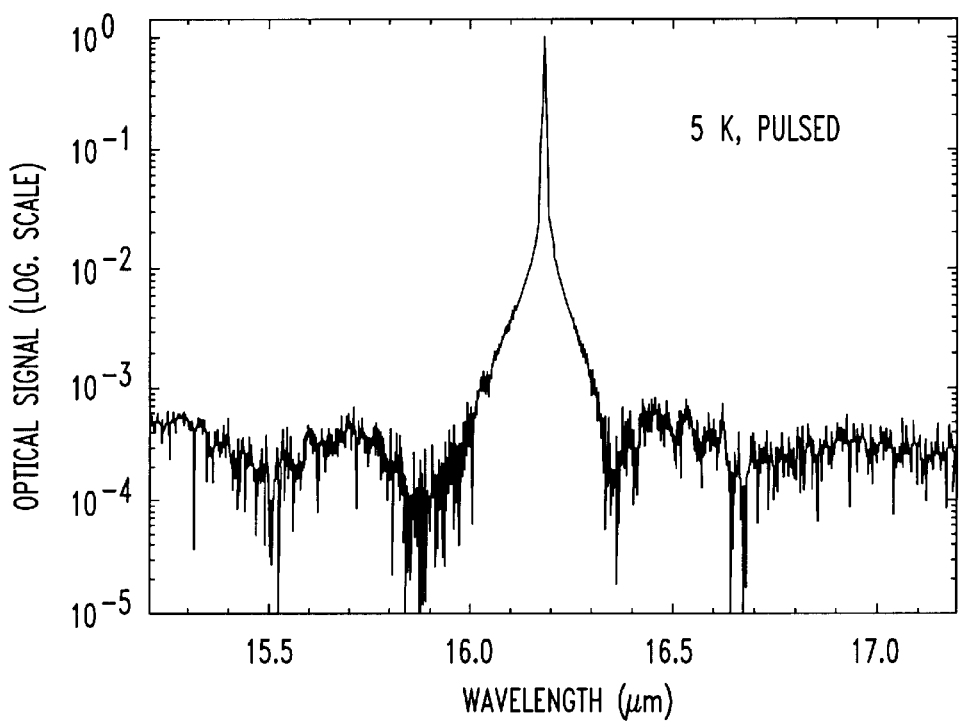
FIG. 6 illustrates the single mode output from an exemplary DFB surface plasmon laser of the present invention.

FIG. 6 illustrates the output of an exemplary DFB surface plasmon laser of the present invention. As shown, the single mode, pulsed emission is clearly evident at a wavelength of 16.2 μm, with the side modes suppressed well below the $10^{-3}$ level.

Figure 7:
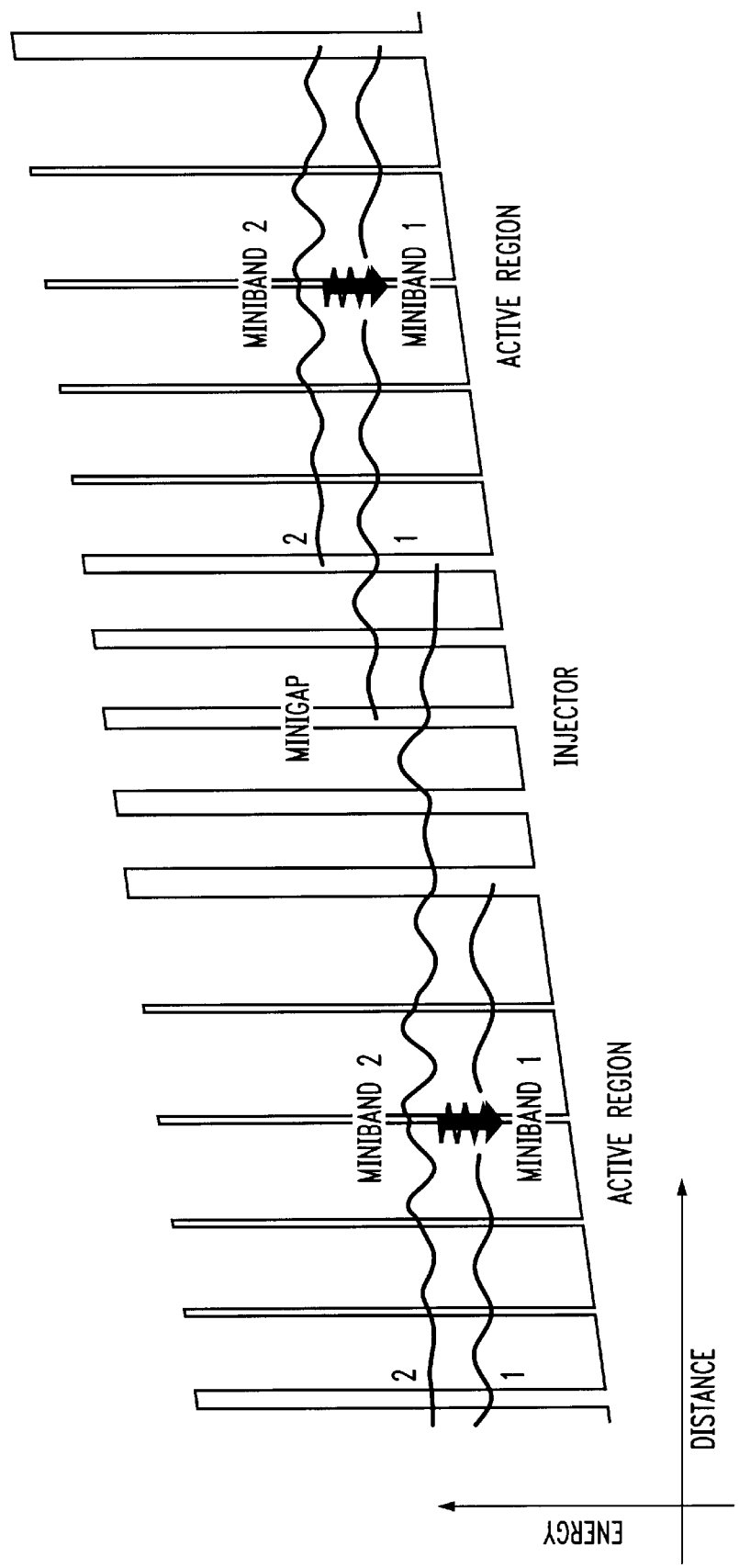
FIG. 7 illustrates an exemplary conduction band diagram of the active region for an exemplary DFB quantum cascade (QC) surface plasmon laser of the present invention.

In one particular embodiment of the present invention, active region 12 of the device may comprise a quantum cascade (QC) structure. In general, a quantum cascade structure consists of a large number of superlattice/injector states, grown for example by solid-source MBE in the InGaAs/AlInAs material system, and lattice-matched to the InP substrate. FIG. 7 illustrates an exemplary conduction band diagram for an exemplary QC superlattice/injector structure. In particular, the energy potential difference within the QC active material variable period superlattices is obtained by periodically alternating nanometer-thick layers of two different semiconductors, to split the conduction band (superlattice region) in narrower energy bands ("minibands") separated by energy gaps ("minigaps"). Laser action can be achieved between the states at the edge of the first minigap through unipolar electron injection via miniband transport. According to the action of QC devices, multiple superlattice regions are bridged together by specially designed injectors which, under the appropriate bias conditions, extract electrons from the lower miniband of one superlattice to inject them into the second miniband of the following one. In this way, many photons can be emitted by each single electron traversing the superlattice region/carrier injector region, leading to large differential. quantum efficiencies (usually much larger than unity). Advantageously, the intersubband and interminiband transitions in semiconductor heterostructures are particularly well-suited, for surface plasmon waveguides, due to the intrinsic TM polarization resulting from their selection rules.

The particular diagram as shown in FIG. 7 illustrates a band structure under an applied bias of 20.5 kV/cm. The actual layer thicknesses in nanometers for an active region/injector stage are (from left to right, starting from the first barrier): 1.5/6.4/0.6/7.2/0.7/8.3/0.7/9.0/0.6/9.6/2.5/4.7/2.0/5.2/1.7/5.2/1.5/5.2. The $Al_{0.48}In_{0.52}As$ layers (energy barriers) are in bold symbols, alternated with the $Ga_{0.47}In_{0.53}As$ wells. The underlined layers are doped to $n_e=2.5\times10^{17}$ cm$^{-3}$; italic style indicates the injector region. The moduli squared of the relevant wavefunctions in the active and injector regions are shown, as is the laser transition (indicated by the wavy arrows in the active regions).

Figure 8:
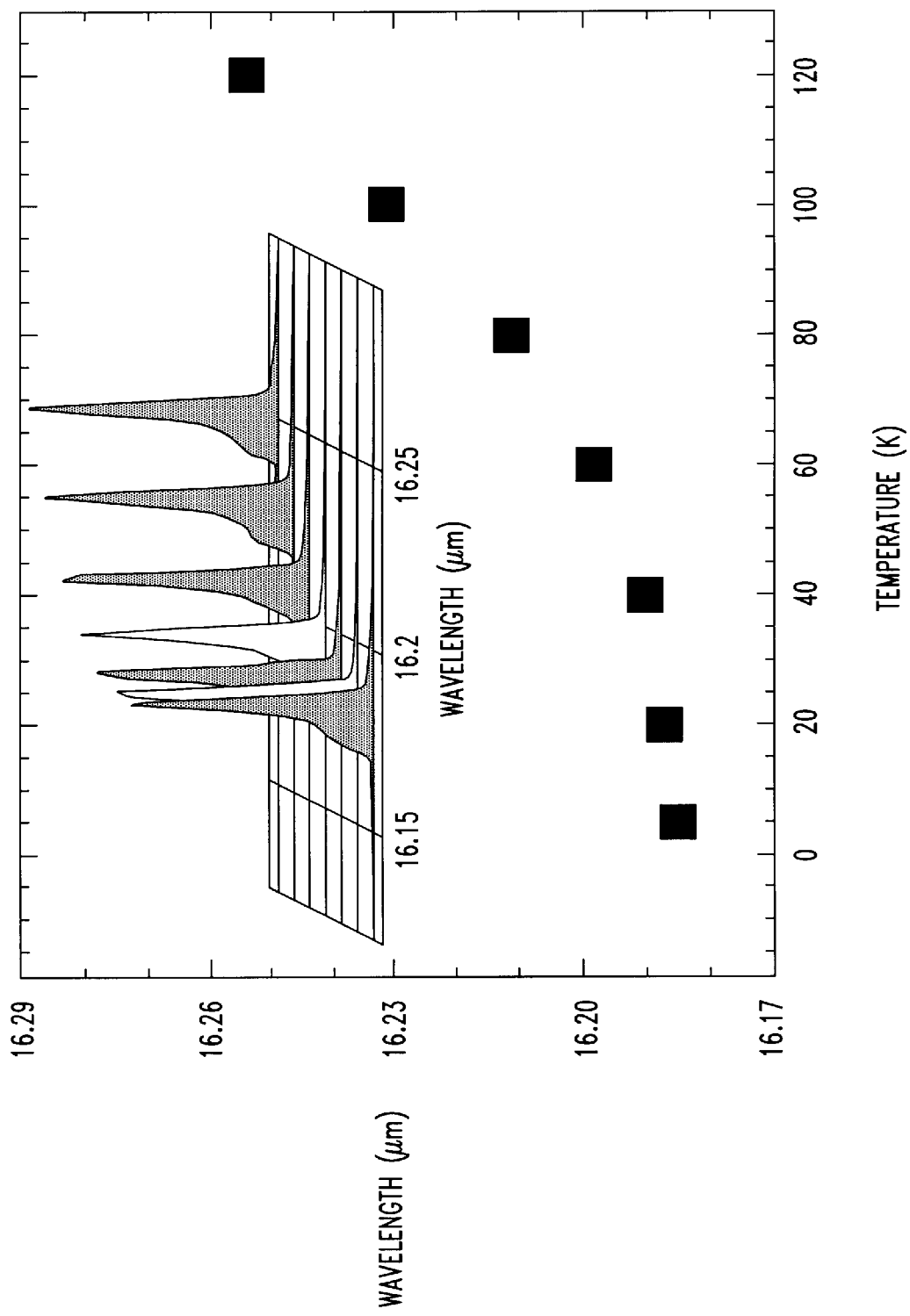
FIG. 8 depicts the ability to "tune" the output wavelength of a single mode DFB-QC plasmon laser of the present invention, tuning as a function of laser ambient temperature.

As mentioned above, it is possible to "tune" the laser frequency of a DFB surface plasmon laser by modifying the ambient temperature of the device, thereby changing its effective refractive index. FIG. 8 includes a plot of a tuning curve of an exemplary DFB surface plasmon laser (and including in an insert the spectra recorded at the various wavelengths). For the example illustrated in FIG. 8, a single mode laser that was 23 μm wide and 1.5 mm long was used, the laser having a Ti/Au—Au periodic grating structure with a period of 2 μm. As shown, the temperature was varied over the range of 5–120 K and produced a wavelength variation from approximately 16.18 μm to almost 16.26 μm. Although the illustrated dependence is evidently non-linear, a linear tuning coefficient can be defined at the highest temperatures. For the particular results illustrated in FIG. 8, a tuning coefficient having a value of 1 nm/K is an acceptable approximation.

Figure 9:
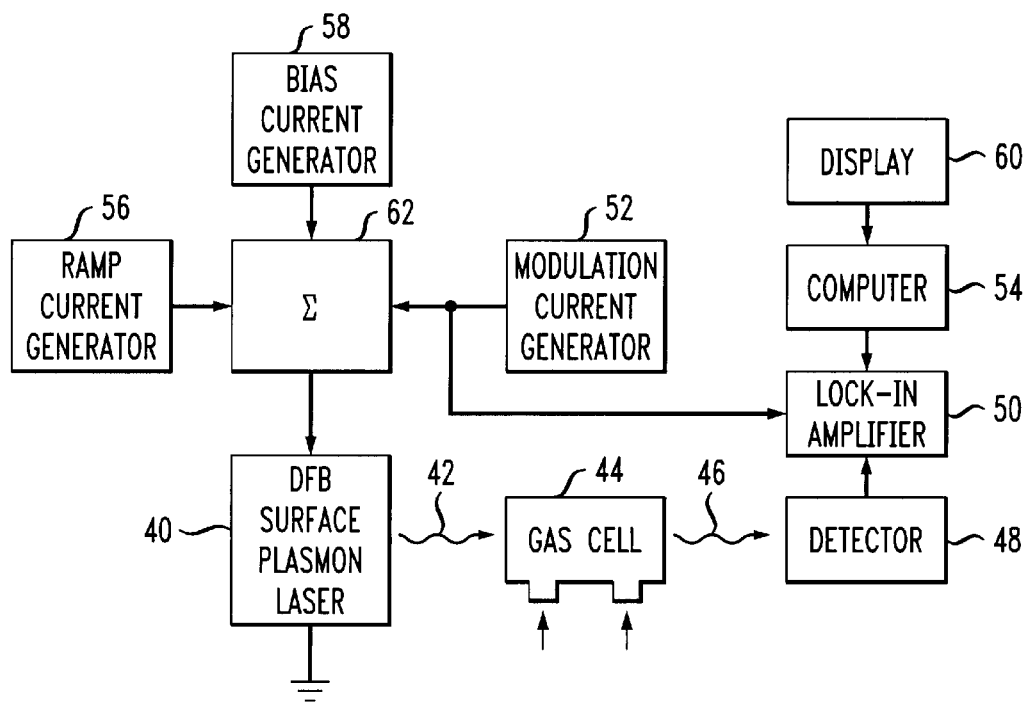
FIG. 9 illustrates one exemplary utilization of the DFB surface plasmon laser of the present invention, in this case as part of a point sensing apparatus.

It is to be understood that the above-described DFB surface plasmon laser structures are merely illustrative of the many possible specific embodiments which can be devised to represent applications of the principles of the present invention. Numerous and varied other arrangements can be devised in accordance with these principles by those skilled in the art without departing from the spirit and scope of the invention. In general, there exist many diverse applications for such a single mode, long wavelength device. A first application is illustrated in FIG. 9, which schematically depicts a point sensing apparatus including a DFB surface plasmon laser 40 of the present invention. Typically, the laser is mounted on a temperature-controlled stage (not shown) for coarse wavelength tuning. Mid-IR radiation 42 from DFB surface plasmon laser 40 passes through a conventional gas cell 44 (optionally a multi-pass cell), with exited radiation 46 impinging on a conventional detector 48. The electrical output from detector 48 is supplied to a lock-in amplifier 50 (together with an appropriate modulation signal, e.g., a 1.2 kHz sine wave from a modulation signal generator 52), and the output from lock-in amplifier 50 is supplied to a computer 54 for data analysis and formatting. The data is then displayed and/or stored in any suitable manner, such as on a visual display 60. DFB surface plasmon laser 40 is pumped with an appropriate electric current. For example, a low frequency current ramp (e.g., 250 ms period) from a ramp current generator 56, short bias pulses (e.g., 5 ns pulse width, 2 μs period) from a bias current generator 58, and a modulation signal from modulation current generator 52 are supplied to a combiner 62. and the resultant current ramp with superimposed current pulses and sine wave is applied as the pulse input to DFB surface plasmon laser 40. The current ramp serves to sweep the laser temperature over a predetermined range, and the pulses cause the emission of short laser pulses. The pulse wavelength is slowly swept over a range of wavelengths, and absorption as a function of wavelength is determined. Thus, the presence in the cell of a gas that has an absorption line in the range of wavelengths is readily detected, and the gas can be identified. As those skilled in the art will recognize, some conventional features are not shown in FIG. 9. For instance, the measurement set-up will typically be under computer control, requiring further inputs to, and outputs from, computer 54. Further, various other arrangements may be used to drive the laser and tune the temperature/wavelength. The arrangement as depicted in FIG. 9 is considered to be exemplary only and not to limit the scope of the teachings of the present invention.

Figure 10:
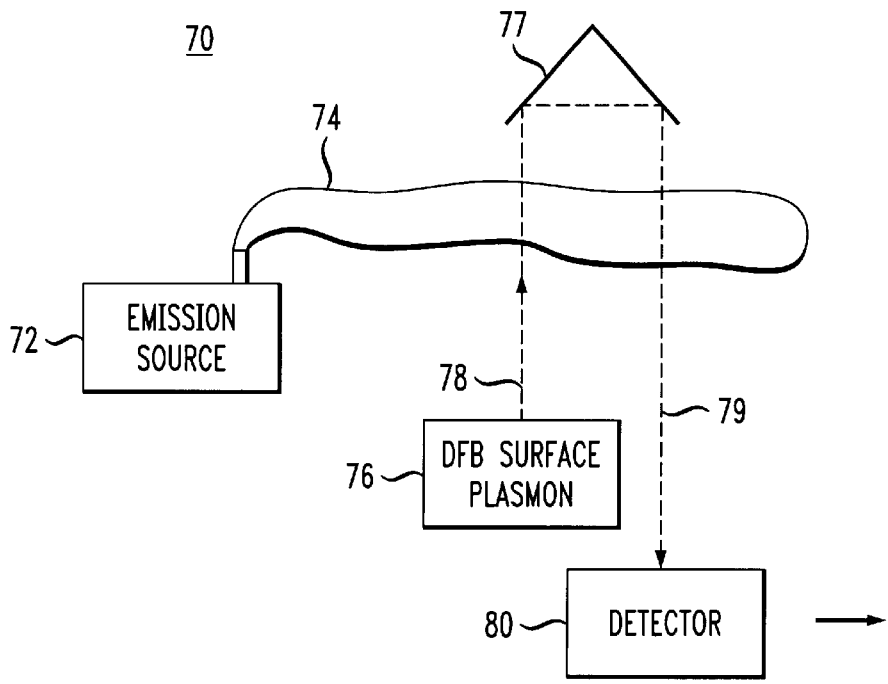
FIG. 10 illustrates an exemplary remote-sensing system including a DFB surface plasmon laser as part of the gas-sensing arrangement.

FIG. 10 schematically depicts an exemplary remote sensing system 70, wherein emission source 72 (e.g., a factory) emits gaseous emission cloud 74. A DFB surface plasmon laser 76 in accordance with the present invention emits radiation 78 which propagates through emission cloud 74 and is reflected (such as by means of a corner reflector 77). Reflected radiation 79 is then detected by a detector 80. DFB surface plasmon laser 76 can be pumped in any appropriate manner (such as described above in associated with FIG. 9, for example) and the output from detector 80 can be utilized in any appropriate manner (also as described above). A mirror or other appropriate reflector can be used in place of corner reflector 72. The reflector may be on an aircraft or any elevated feature, including the smoke stack that is being monitored. Of course, the detector could also be on an aircraft, or be on an elevated feature. In general, any arrangement that results in a line-of-sight disposition of laser and detector is contemplated.

The DFB surface plasmon laser of the present invention will generally be mounted in an appropriate housing for protection and control. The package will typically comprise cooling means (e.g., water cooling or thermoelectric cooling), temperature sensor means (e.g., a thermocouple) for use in a feedback loop for temperature control, and means for applying the pump current to the laser. The laser is attached in conventional fashion to the cooling means. Optionally, the housing may also contain detector means for controlling laser output power. The housing will typically have a window that is transparent for the laser radiation, and will typically be evacuated or filled with inert gas.

What is claimed is:

1. An article comprising a surface plasmon laser structure comprising
   a semiconducting substrate having a top major surface;
   an active region disposed to cover a portion of said semiconducting substrate top major surface, said active region formed as a ridge including sidewalls and a top surface;
   a metallic surface plasmon carrying layer disposed to cover a portion of said active region top surface;
   an insulating layer disposed to cover said active region sidewalls and exposed regions of said semiconducting substrate top major surface; and
   electrical contacts coupled to a bottom major surface of said semiconducting substrate to facilitate flowing an electrical current through the laser
   characterized in that the surface plasmon laser comprises a single mode device and the metallic surface plasmon carrying layer comprises
   a multiple layer metallic arrangement formed as a distributed feedback (DFB) grating arrangement exhibiting a periodic Bragg structure.

2. An article as defined in claim 1 wherein the multiple layer metal grating comprises a dual metal grating.

3. An article as defined in claim 2 wherein the dual metal grating comprises titanium and gold.

4. An article as defined in claim 1 wherein the periodic structure comprises an n-th order Bragg grating.

5. An article as defined in claim 4 wherein the periodic structure comprises a first-order Bragg grating.

6. An article as defined in claim 3 wherein the first-order Bragg grating comprises a periodicity of 2 μm.

7. An article as defined in claim 1 wherein the periodic structure comprises a first-order Bragg grating layer, comprising a first metal, formed on the top surface of the laser active region, and at least one second metal layer disposed to cover both the first metal grating and the remaining exposed portion of the laser active region.

8. An article as defined in claim 7 wherein the first metal is titanium and the at least one second metal is gold.

9. An article as defined in claim 8 wherein the titanium grating layer comprises a thickness of approximately 10 nm and the gold second metal layer comprises a thickness of approximately 300 nm.

10. An article as defined in claim 1 wherein the active region comprises a quantum cascade active unit including a multiplicity of essentially identical multilayer semiconductor repeat units, each comprising a unit active region and a carrier injector region, the unit active region having an upper and a lower energy state, with carrier transition from the upper to the lower energy state resulting in emission of a photon of wavelength $\lambda$.

11. An article as defined in claim 10 wherein each quantum cascade unit active region comprises
   a superlattice region having an upper and a lower miniband, with a minigap therebetween, with the upper energy state being in the upper miniband and the lower energy state being in the lower miniband; and
   the carrier injector region is selected to facilitate carrier transport from the lower miniband of a given repeat unit to the upper miniband of an adjacent downstream repeat unit.

12. An article as defined in claim 10 wherein the photon emission wavelength $\lambda$ is adjusted by changing the ambient temperature of the DFB QC surface plasmon laser.

13. An article as defined in claim 1 wherein the article is a measurement system for measuring infrared radiation absorption by a measurement species, wherein the measurement system comprises a source of single mode infrared laser radiation comprising
   a) the DFB surface plasmon laser of claim 1; and
   b) a detector for detecting the single mode infrared laser radiation after passage thereof through a quantity of said measurement species.

14. A measurement system according to claim 13, wherein said measurement species is a gas disposed in a measurement cell.

15. A measurement system according to claim 13, wherein said measurement species is an unconfined gas.

16. An article as defined in claim 1, further comprising a current source connected to the electrical contacts, said current source providing a laser-heating current to the DFB surface plasmon laser such that the wavelength of the single mode laser radiation varies in accordance with the laser-heating current.

17. An article as defined in claim 16 wherein the laser-heating current comprises a current ramp of duration much greater than the duration of concurrently applied current pulses.

\* \* \* \* \*